United States Patent [19]

Hayakawa et al.

[11] Patent Number: 5,754,558
[45] Date of Patent: May 19, 1998

[54] METHOD AND APPARATUS FOR SCREENING A NONVOLATILE SEMICONDUCTOR MEMORY DEVICE

[75] Inventors: Toshiyuki Hayakawa, Yokohama; Seiji Yamada, Tokyo, both of Japan

[73] Assignee: Kabushiki Kaisha Toshiba, Kawasaki, Japan

[21] Appl. No.: 684,058

[22] Filed: Jul. 19, 1996

[30] Foreign Application Priority Data

Jul. 21, 1995 [JP] Japan ..................... 7-185256

[51] Int. Cl.[6] ..................................... G11C 13/00
[52] U.S. Cl. ........................... 371/21.4; 365/201
[58] Field of Search ................... 371/21.4, 21.2, 371/67.1, 28, 40.4; 365/200, 201, 203, 185, 218, 189.01, 185.03, 185.09, 185.22, 185.24, 185.26, 185.33; 324/765

[56] References Cited

U.S. PATENT DOCUMENTS

| | | | |
|---|---|---|---|
| 5,278,794 | 1/1994 | Tanaka et al. | 365/200 |
| 5,369,615 | 11/1994 | Harrai et al. | 365/218 |
| 5,377,147 | 12/1994 | Merchant et al. | 365/200 |
| 5,416,738 | 5/1995 | Shrivastava | 365/185 |
| 5,428,621 | 6/1995 | Mehrotra et al. | 371/21.4 |
| 5,450,341 | 9/1995 | Sawada et al. | 365/185 |
| 5,513,193 | 4/1996 | Hashimoto | 371/67.1 |
| 5,521,864 | 5/1996 | Kobayashi et al. | 365/185.22 |
| 5,592,415 | 1/1997 | Kato et al. | 365/185.01 |

*Primary Examiner*—Robert W. Beausoliel, Jr.
*Assistant Examiner*—Nadeem Iqbal
*Attorney, Agent, or Firm*—Banner & Witcoff, Ltd.

[57] ABSTRACT

According to a method for screening a nonvolatile semiconductor memory device, data is written to all memory cells. The data is slightly erased such that the memory cells have a positive distribution of threshold voltages. The threshold voltages of the memory cells are measured, and the number of memory cells whose threshold voltages are lower than a reference threshold voltage, is counted. When the counted number is not larger than the number of spare cells provided in a redundant circuit, the memory cells whose threshold voltages are lower than the reference threshold voltage are replaced with the spare cells. When the counted number is larger than the number of spare cells, the nonvolatile semiconductor memory device is determined as a defective one.

30 Claims, 5 Drawing Sheets

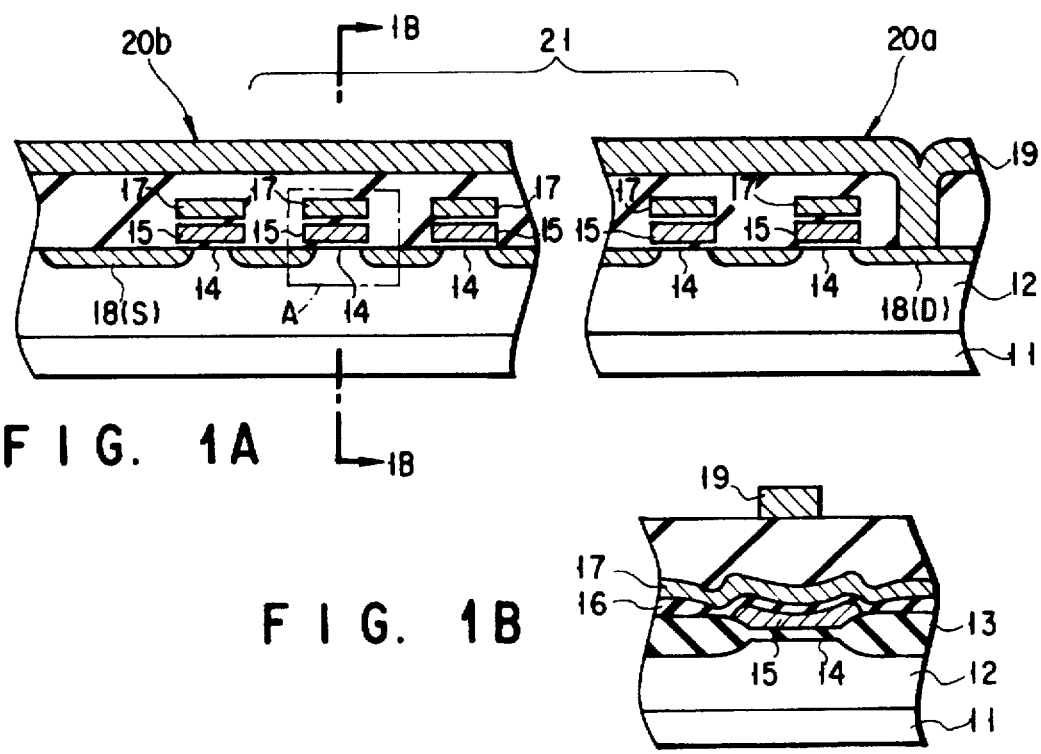
FIG. 1A
FIG. 1B
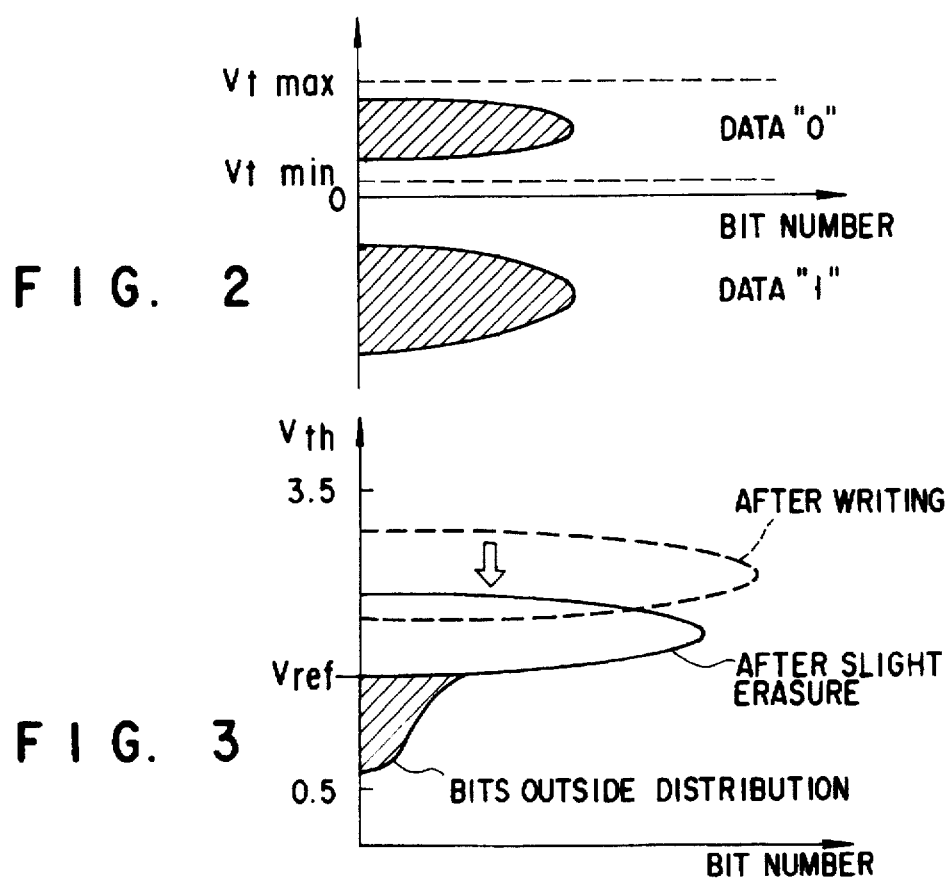
FIG. 2
FIG. 3

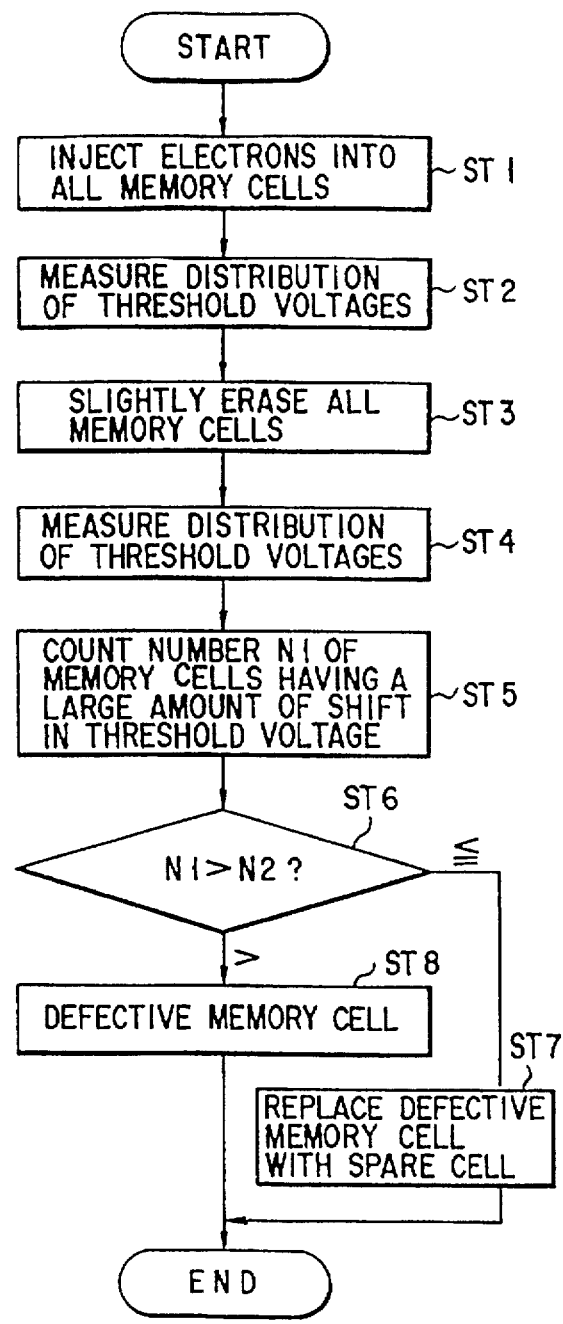
F I G. 4
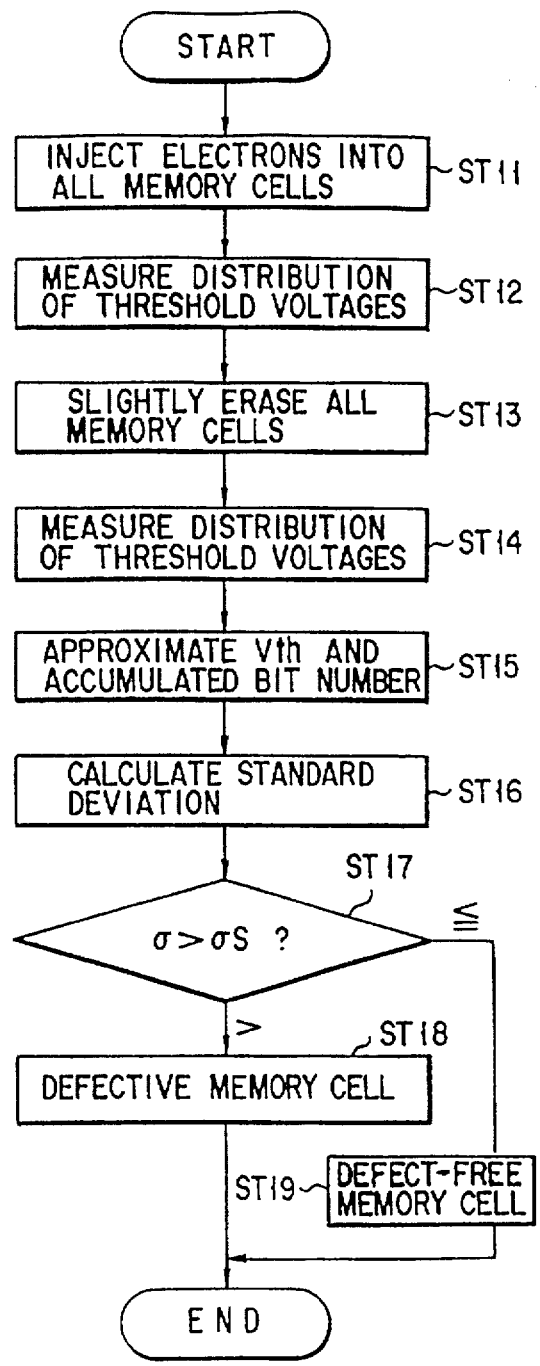
F I G. 6

METHOD AND APPARATUS FOR SCREENING A NONVOLATILE SEMICONDUCTOR MEMORY DEVICE

BACKGROUND OF THE INVENTION

1. Field of the Invention

The present invention relates to a method and an apparatus for screening a nonvolatile semiconductor memory device having a stacked gate structure including a floating gate and a control gate.

2. Description of the Related Art

Memory cells constituting a nonvolatile semiconductor memory device such as an EEPROM (Electrically Erasable Programmable Read Only Memory) each includes a MOS transistor having a two-layered gate structure of a floating gate and a control gate. The memory cell writes/erases data by causing electrons to tunnel through a tunnel oxide film provided between the floating gate and substrate. The threshold voltage of the memory cell is set to a desired value by the writing/erasure, and thus data is stored in the memory cell.

In a NOR type flash EEPROM for reading data at a voltage of, e.g., 5 V, when the threshold voltage of a memory cell is 6.5 V or higher, it is determined that the memory cell stores data "0". When the threshold voltage of a memory cell ranges from 0.5 V to 3.5 V, it is determined that the memory cell stores data "1".

The nonvolatile semiconductor memory device includes a number of memory cells, and the threshold voltages of the memory cells whose write/erase operation has been completed, form the distribution shown in FIG. 11. However, for example, the threshold voltages of memory cells from which data is erased in a time shorter than the normal erase time, are likely to shift from the distribution shown in FIG. 11. These memory cells are poor in data holding characteristic and low in reliability since a large amount of current leaks. For this reason, a nonvolatile semiconductor memory device including these memory cells will malfunction in its initial state.

Conventionally there is a method for screening a nonvolatile semiconductor memory device which causes the above malfunction and, in this method, for example, a high-voltage stress is applied to a memory cell in a data write/erase cycle. Since, however, this method is a sort of breakdown test in which a stress is applied even to a defect-free memory cell, this screening method takes a long time and increases in cost.

There is another screening method which uses the distribution of threshold voltages of memory cells from which data has been erased. In the case of a NAND type flash EEPROM, the threshold voltages become 0 V or less after data is erased therefrom. Since, in this case, no threshold voltages can be measured, the screening method using the distribution of threshold voltages cannot be applied to the NAND type flash EEPROM.

SUMMARY OF THE INVENTION

It is accordingly an object of the present invention to provide a method and an apparatus for easily screening a nonvolatile semiconductor memory device in a relatively short time, without applying a write/erase cycle stress to the device, even though the device has the distribution of negative threshold voltages.

The above object is attained by the following constitution:

According to one aspect of the present invention, there is provided a method for screening a nonvolatile semiconductor memory device, comprising the steps of:

writing data to all memory cells constituting a memory cell array, each of all the memory cells having a floating gate and being formed of an electrically erasable MOS transistor;

slightly erasing all the memory cells and then keeping threshold voltages of all the memory cells positive;

measuring the threshold voltages of all the memory cells and counting the number of memory cells whose threshold voltages are each not higher than a reference voltage; and determining the nonvolatile semiconductor memory device as a defective device when the counted number is larger than a reference number.

According to another aspect of the present invention, there is provided an apparatus for screening a nonvolatile semiconductor memory device, comprising:

a memory cell array including a plurality of memory cells, each of the plurality of memory cells having a floating gate and being formed of an electrically erasable MOS transistor;

a first voltage generation circuit for generating a first voltage for writing data and applying the first voltage to the plurality of memory cells, the plurality of memory cells having threshold voltages increasing in accordance with the first voltage;

a second voltage generation circuit for generating a second voltage which is lower than the first voltage and applying the second voltage to the plurality of memory cells, data of the plurality of memory cells being slightly erased such that threshold voltages of the plurality of memory cells are kept positive in accordance with the second voltage;

a measurement circuit for measuring the threshold voltages of the plurality of memory cells; and control means for counting the number of memory cells having threshold voltages which are measured by the measurement circuit and are not higher than a reference voltage, and determining the nonvolatile semiconductor memory device as a defective device when the counted number is larger than a reference value.

According to the present invention described above, a nonvolatile semiconductor memory device can be screened nondestructively since no stress is applied to the nonvolatile semiconductor memory device in the write/erase cycle. The screening can be performed easily in a short time and thus reduced in cost. The present invention can be applied to a method for screening a device, such as a NAND type flash EEPROM, in which the threshold voltages of memory cells become negative after data is erased.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1A is a cross-sectional view showing the constitution of a NAND type flash EEPROM;

FIG. 1B is a cross-sectional view taken along line 1B—1B of FIG. 1A;

FIG. 2 is a view showing the distribution of threshold voltages of the NAND type flash EEPROM to/from which data has been written/erased, according to a first embodiment of the present invention;

FIG. 3 is a view showing the distribution of threshold voltages of the NAND type flash EEPROM to which data has been written and from which data has been slightly erased, according to the first embodiment of the present invention;

FIG. 4 is a flowchart for explaining a screening operation according to the first embodiment of the present invention;

FIG. 6 is a flowchart for explaining a screening operation according to the second embodiment of the present invention;

DETAILED DESCRIPTION OF THE PREFERRED EMBODIMENTS

Figure 5:
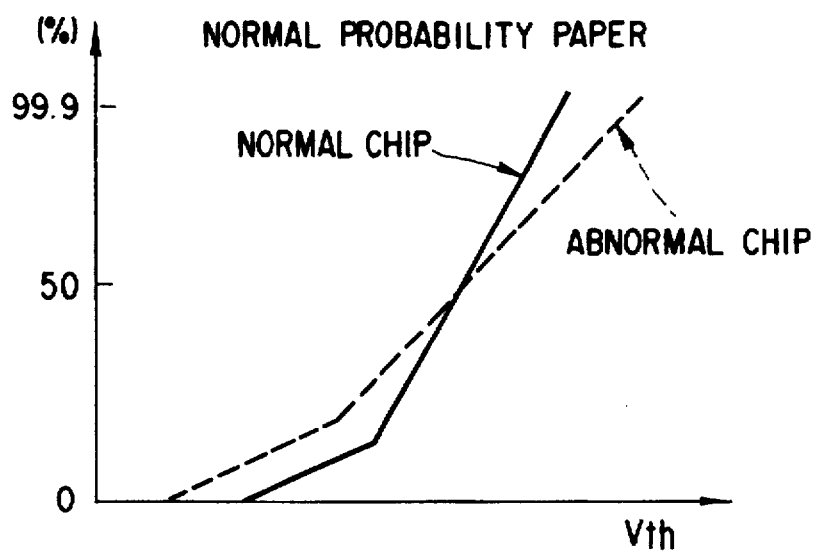
FIG. 5 is a view showing the relationship between the number of accumulated bits and threshold voltages of a NAND type flash EEPROM from which data is slightly erased, according to a second embodiment of the present invention.

Embodiments of the present invention will now be described with reference to the accompanying drawings.

Referring first to FIGS. 1A and 1B, a memory cell of a NAND type flash EEPROM will be described. In FIGS. 1A and 1B, a P-type well 12 is formed in an N-type silicon substrate 11. Element isolating insulation films 13 are formed in the surface region of the well 12. A plurality of memory cells are formed between the element isolating insulation films 13. These memory cells are each constituted by floating gate MOS transistors. Each of the MOS transistors is constituted by a gate insulation film 14, a floating gate 15, an interlayer insulation film 16, and a control gate 17, which are formed in sequence one on another, and source and drain regions 18 (S, D) formed in the surface region of the well 12 and on both sides of the floating gate 15. For example, one NAND-structured cell includes sixteen floating gate MOS transistors. The source and drain regions of the MOS transistors are connected in series thereby to form a series of MOS transistors. The MOS transistors at both ends of the series of MOS transistors operate as selective gate transistors 20a and 20b, and a group of the other MOS transistors arranged therebetween serves as a memory cell 21. A bit line 19 of aluminum wiring is connected to the drain 18 (D) of the selective gate transistor 20a, and the source 18 (S) of the selective gate transistor 20b serves as a common source.

In the above-described constitution, when data is written to the memory cell indicated by A in FIG. 1A, a write voltage VPPW (e.g., 20 V) is applied to the control gate 17 and a voltage of 0 V is applied to the well 12. When data is erased from the memory cell, an erase voltage VPPE (e.g., 20 V) is applied to the well 12 and a voltage of 0 V is applied to the control gate 17.

FIGS. 2 to 4 show the first embodiment of the present invention. A method for screening a defective memory cell in the above NAND type flash EEPROM will now be described with reference to FIGS. 2 to 4. FIG. 2 illustrates the distribution of threshold voltages of memory cells to/from which data has been normally written/erased. The writing is performed by Fowler-Nordheim Tunneling at a write voltage VPPW for a write time tPW, while the erasing is done by Fowler-Nordheim Tunneling at an erase voltage VPPE for an erase time tPE. In the NAND type flash EEPROM, the threshold voltages become negative when the erasing is performed.

In the first embodiment, electrons are first injected into the floating gates of all the memory cells through a write operation to set the threshold voltages of the memory cells positive (step ST1), and then the threshold voltages are measured to obtain the distribution thereof (step ST2). In the write operation, the write voltage VPPW and write time tPW are set in such a manner that the threshold voltages of all the memory cells range from Vtmin (e.g., 0.5 V) to Vtmax (e.g., 3.5 V). The distribution of threshold voltages obtained in step ST2 is indicated by the dotted line in FIG. 3. The step ST2 can be omitted. Then, data of all the memory cells are slightly erased on such a condition as to inhibit the threshold voltages from changing to the negative, that is, the data are erased from the memory cells at a voltage lower than the erase voltage VPPE, in a time shorter than the erase time tPE (step ST3). After that, the threshold voltages of the respective memory cells are measured again to obtain the distribution thereof (step ST4). The distribution is slightly shifted to the negative as indicated by the solid line in FIG. 3. The threshold voltages of memory cells whose erase time is short, are shifted to the negative more greatly than those of normal memory cells, as shown by the oblique lines in FIG. 3. The number of memory cells whose threshold voltages are shifted more greatly are counted (step ST5) and, in other words, the number of memory cells whose threshold voltages are lower than the reference voltage Vref shown in FIG. 3. The count value N1 is compared with a reference value N2, that is, the number of spare cells provided in a redundant circuit (step ST6). When N1 is not larger than N2, defective memory cells are replaced with spare cells (step ST7). When N1 exceeds N2, the memory cells are determined as defective ones (step ST8).

With the above method, the memory cells whose threshold voltages are greatly shifted to the negative, i.e., whose erase time is shorter than that of normal memory cells, can be screened. Since a plurality of stresses need not be applied to the memory cells by writing/erasing, they can easily be screened in a short time. Since, furthermore, the distribution of positive threshold voltages is monitored, the method can be applied to screening of the NAND type flash EEPROM whose threshold voltage becomes negative after data is erased from the EEPROM.

If, in the initial writing, the distribution of threshold voltages is set to a proper positive value, neither the write voltage is limited to VPPW nor the write time is limited to tPW. In the first embodiment, the present invention is applied to the device in which the distribution of threshold voltages of memory cells from which data is erased becomes negative. It is however needless to say that the present invention is applicable to a device such as a NOR type flash EEPROM wherein the distribution of memory cells becomes positive.

A screening method of the second embodiment of the present invention will now be described with reference to FIGS. 5 and 6.

Like in the foregoing first embodiment, the write voltage VPPW and write time tPW are properly set in such a manner that the threshold voltages of all memory cells of a NAND type flash EEPROM range from Vtmin (e.g., 0.5 V) to Vtmax (e.g., 3.5 V), and electrons are injected into floating gates of the memory cells (step ST11). The threshold voltages of the memory cells are measured to obtain the distribution thereof (step ST12). The step ST12 can be omitted. Then data of the memory cells are slightly erased on such a condition as to inhibit the threshold voltages from becoming negative, that is, the data are erased from the memory cells at a voltage lower than the erase voltage VPPE, in a time shorter than the erase time tPE (step ST13), and the threshold voltages are measured again (step ST14). The relationship between the measured threshold voltages and the number of accumulated bits are approximated by the normal probability distribution (step ST15).

FIG. 5 shows the normal probability distribution using normal probability paper. In FIG. 5, the solid line indicates the characteristic of a memory whose threshold voltage is normal, while the dotted line shows that of a memory whose threshold voltage is abnormal. In the vicinity of the center of the normal probability distribution, standard deviation σ is calculated (step ST16) and compared with a reference value σs (step ST17). The memory is determined as a defective one if σ is larger than σs (step ST18), while it is determined as a defect-free one if σ is not larger than σs (step ST19).

The screening method of the second embodiment produces the same advantage as that of the first embodiment. In the initial write operation, neither the write voltage is limited to VPPW nor the write time is limited to tPW if the distribution of threshold voltages falls within an appropriate positive value. The second embodiment is applied to the device with the negative distribution of threshold voltages of memory cells from which data is erased. It is needless to say that it can be applied to a device with the positive distribution thereof.

A screening method according to the third embodiment of the present invention will now be described with reference to FIGS. 7 and 8.

First a write operation is performed by one appropriate pulse such that all memory cells of a NAND type flash EEPROM have positive threshold voltages, and electrons are injected into the floating gates of the memory cells (step ST21). The pulse is so generated that write voltage VPPW is, e.g., 20 V and write time (pulse width) tPW is, e.g., 40 μsec. Then the threshold voltages of the respective memory cells are measured to obtain the distribution of the threshold voltages (step ST22).

Figure 7:
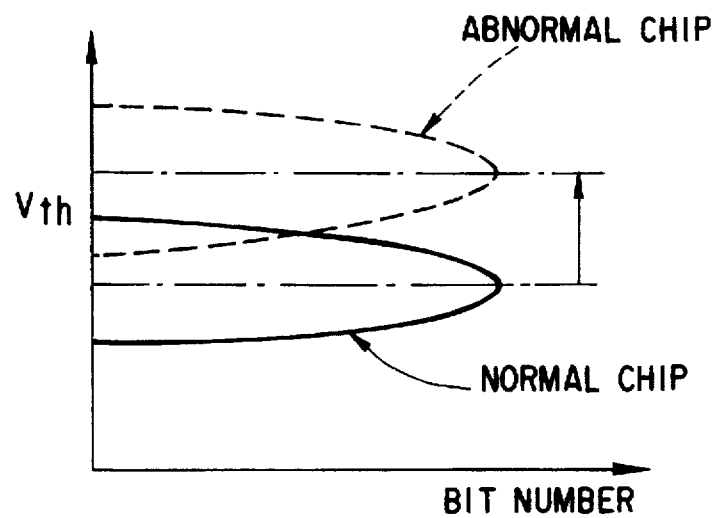
FIG. 7 is a view showing the distribution of threshold voltages of a NAND type flash EEPROM to which data has been written, according to a third embodiment of the present invention.
Figure 11:
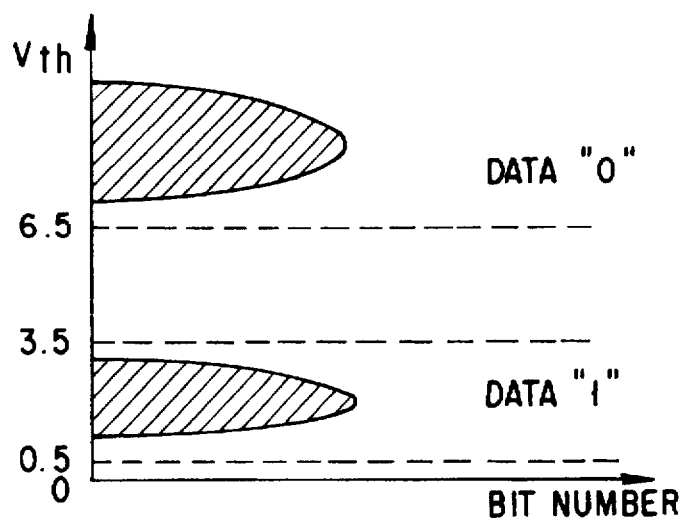
FIG. 11 is a view showing the distribution of threshold voltages of a prior art NOR type flash EEPROM to/from data is written/erased.
Figure 8:
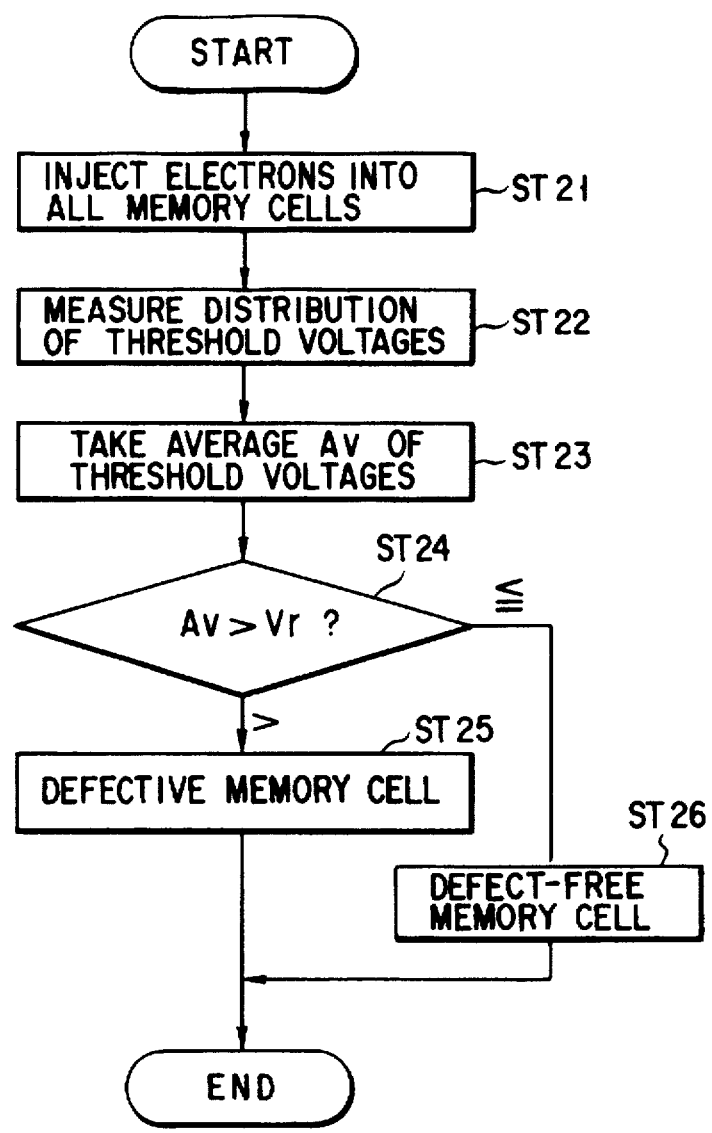
FIG. 8 is a flowchart for explaining a screening operation according to the third embodiment of the present invention.

FIG. 7 shows the distribution of the threshold voltages in the third embodiment. The average value Av of the threshold voltages is calculated (step S23) and compared with a reference value Vr (step ST24). The memory is determined as a defective one if Av is larger than Vr (step ST25), while it is determined as a defect-free one if Av is not larger than Vr (step ST26). The threshold voltages correspond to the number of electrons injected into the floating gates. The fact that the average value Av is larger than the reference value Vr, means that there are memory cells with the floating gates into which electrons are injected more than usual. It is thus possible to screen a semiconductor chip whose threshold voltage is shifted greatly by a single write operation.

The third embodiment also produces the same advantage as that of each of the first and second embodiments. In the third embodiment, the number of pulses for writing need not be one, but can be freely set within a range of allowable test time. In the third embodiment, the electrons are injected into the floating gates. The third embodiment is not limited to this, but can be applied to the case where electrons are discharged from the floating gates, that is, data is erased; however, in this case, the memory cells from which data is erased should be positive.

The first to third embodiments described above are applied to the device whose threshold voltages exhibit the negative distribution after data is erased from the device. However, the present invention is not limited to such a device. It is needless to say that the present invention can be applied to a device, such as a NOR type flash EEPROM, in which the distribution of threshold voltages is positive after data is erased from the device.

Figure 9:
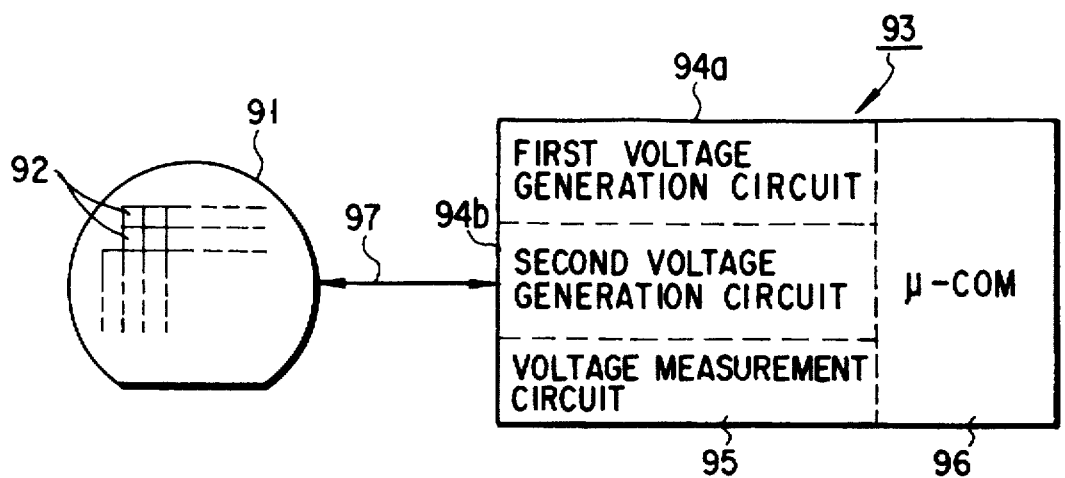
FIG. 9 is a schematic view showing an example of a screening apparatus according to the present invention.

FIG. 9 illustrates an example of a screening test apparatus to which the present invention is applied. For example, the screening methods of the first to third embodiments are executed for a wafer. FIG. 9 shows a wafer 91 having a plurality of chips 92. For example, a NAND type flash EEPROM, as shown in FIGS. 1A and 1B, and its peripheral circuit (not shown) are formed in each of the chips 92. A screening test apparatus 93 is connected to the wafer 91 through, e.g., a probe 97 and includes a first voltage generation circuit 94a, a second voltage generation circuit 94b, a voltage measurement circuit 95, and a microcomputer (μ-COM.) 96. The first voltage generation circuit 94a generates high voltages for writing and erasing data. The high voltage for writing data can be replaced with a pulse voltage having a predetermined pulse width as described in the foregoing third embodiment. The second voltage generation circuit 94b generates a voltage which is lower than the writing high voltage, and this voltage is used for slightly erasing data. The voltage measurement circuit 95 measures a threshold voltage read out of the memory cell. The microcomputer 96 controls the whole of the test apparatus 93 and executes one of the screening methods according to the first to third embodiments. More specifically, the microcomputer 96 stores programs for performing an operation corresponding to one of the flowcharts shown in FIGS. 4, 6 and 8, and controls the operations of the first and second voltage generation circuits 94a and 94b and the voltage measurement circuit 95 in accordance with the programs.

The test apparatus 93 cannot be only provided outside a chip but also incorporated in the chip.

Figure 10:
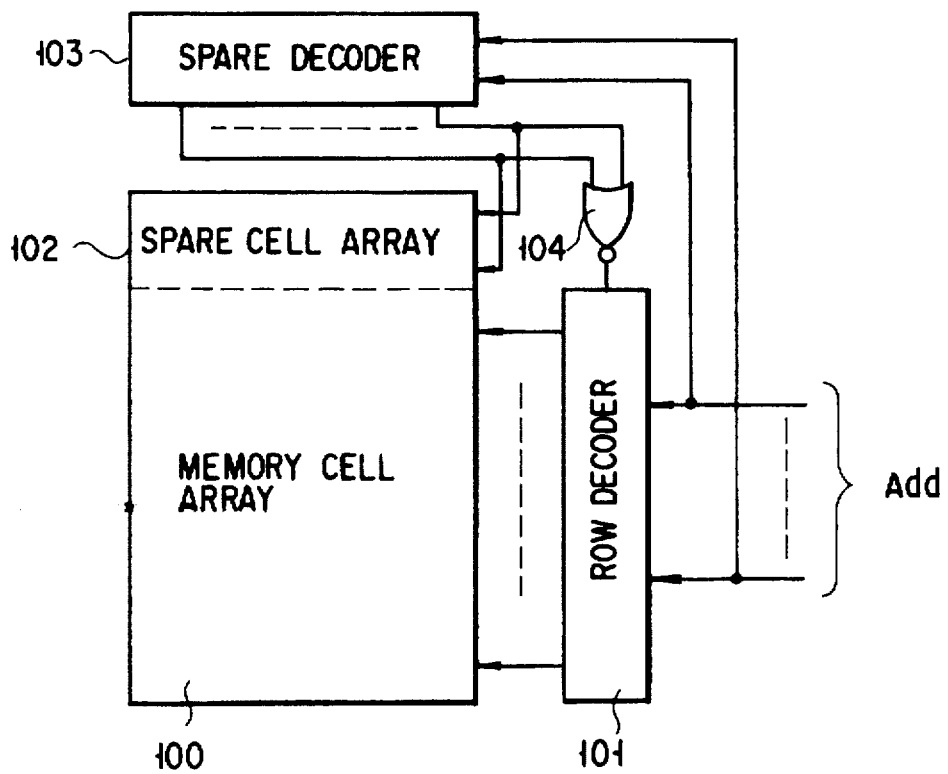
FIG. 10 is a schematic view showing an example of a redundant circuit of the present invention.

FIG. 10 illustrates the main part of a nonvolatile semiconductor memory device, that is, a redundant circuit thereof. A memory cell array 100 includes a NAND type flash EEPROM as shown in FIGS. 1A and 1B, and a row decoder 101 selects one of row lines of the memory cell array 100 in response to an address signal Add. The memory cell array 100 is provided with a spare cell array 102, and the spare cell array 102 includes a plurality of spare cells having the same configuration as that of the memory cells arranged in the memory cell array 100. A spare decoder 103 selects the spare cells when a received address signal indicates a defective cell of the memory cell array 100. In other words, when a defective cell is detected from the memory cell array 100 by the screening method of the first embodiment, a fuse element (not shown) of the spare decoder 103 is programmed in accordance with address information of the detected defective cell. When an address signal corresponding to the defective cell is supplied to the spare decoder 103, the spare decoder 103 selects a spare cell in place of the defective cell. A NOR circuit 104 inhibits the row decoder 101 from selecting a row line when the spare decoder 103 outputs a signal for selecting a spare cell.

What is claimed is:

1. A method for screening a nonvolatile semiconductor memory device comprising electrically erasable memory cells arranged in a memory cell array, each memory cell having a threshold voltage set in accordance with the amount of charge stored on a charge storing layer thereof and each memory cell having a normal erase state in which the threshold voltage thereof is to be set within a first threshold voltage range, the method comprising the steps of:

writing data to said memory cells by setting the threshold voltages thereof to be within a second threshold voltage range;

slightly erasing said memory cells by setting the threshold voltage thereof to be in a third threshold voltage range between the first and second threshold voltage ranges, wherein the third threshold voltage range is a range of positive threshold voltage;

measuring the threshold voltages of said slightly erased memory cells and counting the number of slightly erased memory cells whose threshold voltages are lower than a reference voltage; and determining that said nonvolatile semiconductor memory device is defective when the counted number of slightly erased memory cells is greater than a reference number.

2. A method according to claim 1, wherein the first threshold voltage range is a range of negative threshold voltages.

3. A method according to claim 1, wherein said memory cells are slightly erased using a voltage which is lower than a normal erase voltage for setting the threshold voltages of said memory cells to be within the first threshold voltage range during a normal erase operation.

4. A method according to claim 1, wherein said memory cells are slightly erased in a time which is shorter than a normal erase time for setting the threshold voltages of said memory cells to be within the first threshold voltage range during a normal erase operation.

5. A method according to claim 1, wherein the reference number is equal to the number of memory cells of said memory cell array which are replaceable with redundant memory cells.

6. A method according to claim 1, wherein electrons are injected into the charge storage layer of each of said memory cells using Fowler-Nordheim tunneling, while electrons are emitted from the charge storage layer of each of said memory cells using Fowler-Nordheim tunneling.

7. A method for screening a nonvolatile semiconductor memory device comprising electrically erasable memory cells arranged in a memory cell array, each memory cell having a threshold voltage set in accordance with the amount of charge stored on a charge storing layer thereof and each memory cell having a normal erase state in which the threshold voltage thereof is set to be within a first threshold voltage range, the method comprising the steps of:

writing data to said memory cells by setting the threshold voltages thereof to be within a second threshold voltage range;

slightly erasing said memory cells by setting the threshold voltages thereof to be in a third threshold voltage range between said first and second threshold voltage ranges, wherein the third threshold voltage range is a range of positive threshold voltages;

measuring the threshold voltages of said slightly erased memory cells;

approximating a relationship between the measured threshold voltages of said slightly erased memory cells and an accumulated bit number using a normal probability distribution, and determining that said nonvolatile semiconductor memory device is defective when the standard deviation in a central portion of the normal probability distribution exceeds a reference value.

8. A method according to claim 7, wherein the first threshold voltage range is a range of negative threshold voltages.

9. A method according to claim 7, wherein said memory cells are slightly erased using a voltage which is lower than a normal erase voltage for setting the threshold voltages of said memory cells to be within the first threshold voltage range during a normal erase operation.

10. A method according to claim 7, wherein said memory cells are slightly erased in a time which is shorter than a normal erase time for setting the threshold voltages of said memory cells to be within the first threshold voltage range during a normal erase operation.

11. A method according to claim 7, wherein electrons are injected into the charge storage layer of each of said memory cells using Fowler-Nordheim tunneling, while electrons are emitted from the charge storage layer of each of said memory cells using Fowler-Nordheim tunneling.

12. A method for screening a nonvolatile semiconductor memory device comprising electrically erasable memory cells arranged in a memory cell array, each memory cell having a threshold voltage set in accordance with the amount of charge stored on a charge storing layer thereof, the method comprising the steps of:

applying a pulse voltage to said memory cells to shift the threshold voltages of said memory cells from a first threshold voltage range to a second threshold voltage range;

measuring the threshold voltages of said memory cells to obtain an average value of the threshold voltages in the second threshold voltage range; and determining that said nonvolatile semiconductor memory device is defective when the average value of the threshold voltages in the second threshold voltage range exceeds a reference value.

13. A method according to claim 12, wherein the threshold voltages of said memory cells are shifted by injecting electrons into the charge storage layers of said memory cells.

14. A method according to claim 12, wherein the threshold voltages of said memory cells are shifted by emitting electrons from the charge storage layers of said memory cells.

15. A method according to claim 12, wherein said memory cells have erased states in which the threshold voltages thereof are set in a third threshold voltage range, wherein the third threshold range is a range of negative threshold voltages.

16. An apparatus for screening a nonvolatile semiconductor memory device, comprising:

a memory cell array including electrically erasable memory cells, each of said memory cells having a threshold voltage set in accordance with the amount of charge stored on a charge storing layer thereof and each memory cell having a normal erase state in which the threshold voltage thereof is set to be within a first threshold voltage range;

a first voltage generating circuit for generating a first voltage and for applying the first voltage to said memory cells to write data thereto, wherein the threshold voltages of said memory cells are set to be within a second thresholdvoltage range in accordance with the first voltage;

a second voltage generating circuit for generating a second voltage which is lower than the first voltage and for applying the second voltage to said memory cells to slightly erase data therefrom, wherein the threshold voltages of said memory cells are set to be in a third threshold voltage range between the first and second voltage ranges in accordance with the second voltage, the third threshold voltage range being a range of positive threshold voltages;

a measurement circuit for measuring the threshold voltages of said slightly erased memory cells; and a control circuit for counting the number of slightly erased memory cells which are measured by said measurement circuit as having threshold voltages lower than a reference voltage, and for determining that said nonvolatile semiconductor memory device defective when the counted number is larger than a reference value.

17. An apparatus for screening a nonvolatile semiconductor memory device, comprising:

a memory cell array including electrically erasable memory cells, each of said memory cells having a threshold voltage set in accordance with the amount of charge stored on a charge storing layer thereof and each memory cell having a normal erase state in which the threshold voltage thereof is set to be within a first threshold voltage range;

a first voltage generating circuit for generating a first voltage and for applying the first voltage to said memory cells to write data thereto, wherein the threshold voltages of said memory cells are set to be in a second threshold voltage range in accordance with the first voltage;

a second voltage generating circuit for generating a second voltage which is lower than the first voltage and for applying the second voltage to said memory cells to slightly erase data therefrom, wherein the threshold voltages of said memory cells are set to be in a third threshold voltage range between the first and second threshold voltage ranges in accordance with the second voltage, the third threshold voltage range being a range of positive threshold voltages;

a measurement circuit for measuring the threshold voltages of said slightly erased memory cells; and a control circuit for approximating a relationship between the measured threshold voltages of said slightly erased memory cells and an accumulated bit number using a normal probability distribution, and determining that said nonvolatile semiconductor memory device is defective when the stand distribution exceeds a reference value.

18. An apparatus for screening a nonvolatile semiconductor memory device, comprising:

a memory cell array including electrically erasable memory cells, each of said memory cells having a threshold voltage set in accordance with the amount of charge stored on a charge storing layer thereof;

a voltage generating circuit for generating a pulse voltage and for applying the pulse voltage to said plurality of memory cells, wherein the threshold voltages of said memory cells are shifted from a first threshold voltage range to a second threshold voltage range in accordance with the pulse voltage; and a control circuit for measuring the threshold voltages of said memory cells to obtain an average value of the threshold voltages in the second threshold voltage range, and for determining that said nonvolatile semiconductor memory device is defective when the average value exceeds a reference value.

19. A method according to claim 1, wherein the charge storage layers of said memory cells comprise floating gate electrodes.

20. A method according to claim 1, wherein said memory cells are arranged in a NAND configuration.

21. A method according to claim 7, wherein the charge storage layers of said memory cells comprise floating gate electrodes.

22. A method according to claim 7, wherein said memory cells are arranged in a NAND configuration.

23. A method according to claim 12, wherein the charge storage layers of said memory cells comprise floating gate electrodes.

24. A method according to claim 12, where in said memory cells are arranged in a NAND configuration.

25. An apparatus according to claim 16, wherein the charge storage layers of said memory cells comprise floating gate electrodes.

26. An apparatus according to claim 16, wherein said memory cells are arranged in a NAND configuration.

27. An apparatus according to claim 17, wherein the charge storage layers of said memory cells comprise floating gate electrodes.

28. An apparatus according to claim 17, wherein said memory cells are arranged in a NAND configuration.

29. An apparatus according to claim 18, wherein the charge storing layers of said memory cells comprise floating gate electrodes.

30. An apparatus according to claim 18, wherein said memory cells are arranged in a NAND configuration.

* * * * *

UNITED STATES PATENT AND TRADEMARK OFFICE
CERTIFICATE OF CORRECTION

PATENT NO. : 5,754,558
DATED : May 19, 1998
INVENTOR(S) : Toshiyuki Hayakawa and Seiji Yamada It is certified that error appears in the above-identified patent and that said Letters Patent is hereby corrected as shown below:

In claim 1, line 16, change "voltage" to --voltages--.

In claim 16, line 14, change "thresholdvoltage" to --threshold voltage--.

In claim 16, line 31, insert --is-- before "defective".

Signed and Sealed this

Thirteenth Day of October 1998

Attest:

BRUCE LEHMAN

Attesting Officer

Commissioner of Patents and Trademarks